United States Patent [19]
El Hamamsy et al.

[11] 4,307,298
[45] Dec. 22, 1981

[54] OPTICALLY TOGGLED BILATERAL SWITCH HAVING LOW LEAKAGE CURRENT

[75] Inventors: Mahmoud A. El Hamamsy, Watchung; William C. King, Chatham Township, Morris County, both of N.J.

[73] Assignee: Bell Telephone Laboratories, Incorporated, Murray Hill, N.J.

[21] Appl. No.: 119,312

[22] Filed: Feb. 7, 1980

[51] Int. Cl.³ ............................................. G02B 27/00
[52] U.S. Cl. ..................................... 250/551; 307/311
[58] Field of Search ............... 250/208, 209, 551, 578; 307/311; 357/19

[56] References Cited

U.S. PATENT DOCUMENTS 3,321,631 5/1967 Biard et al. ........................ 307/311
4,158,144 6/1979 Krause ............................... 307/311
4,227,098 10/1980 Brown et al. ...................... 250/551

*Primary Examiner*—David C. Nelms
*Attorney, Agent, or Firm*—Richard D. Laumann

[57] ABSTRACT

An optically toggled bilateral field effect transistor switch having a low leakage current is described. A high impedance path and, therefore, a low leakage current, is provided by a photovoltaically controlled field effect transistor.

9 Claims, 3 Drawing Figures

OPTICALLY TOGGLED BILATERAL SWITCH HAVING LOW LEAKAGE CURRENT

TECHNICAL FIELD

This invention is concerned generally with optically toggled switches and particularly with optically toggled bilateral switches having low leakage currents.

BACKGROUND OF THE INVENTION

Devices that transmit signals between input and output circuits that are electrically isolated from each other are presently of considerable commercial importance. For many purposes, electromechanical relays or isolation transformers can both provide adequate electrical isolation and transmit signals between the input and output circuits. However, these devices suffer drawbacks, e.g., large physical size, when compared to solid state circuitry.

To overcome these drawbacks, as well as for other purposes, solid state devices, commonly referred to as opto-isolators, have been developed that use optical coupling between the electrical input and output circuits. The essential elements of the devices are a light source located in the input circuit and a photodetector located in the output circuit and optically coupled to the light source. Many presently used opto-isolators have a GaAs light emitting diode as the light source and a Si photodiode as the photodetector. Light is used in this specification to mean electromagnetic radiation in the visible and near infrared regions, i.e., radiation having wavelengths between approximately 0.5 $\mu$m and 2.0 $\mu$m. For example, GaAs diodes emit in the infrared. Current in the input circuit passing through the light source causes it to emit light, and some of this light is received by the photodetector and causes an electrical current to be generated or controlled in the output circuit. Opto-isolators provide the advantages of complete electrical isolation between the input and output circuits and small size.

The photodetector may take any of several forms. For example, a silicon photodiode or a photosensitive field effect transistor (FET) may be used. Recently, arrays of series connected photodiodes have been used to photovoltaically control nonphotosensitive field effect transistors. Upon illumination by the light source, the photodiode array produces a voltage between the FET gate and another FET electrode which changes the current conduction state of the FET from its initial to its complementary state. Upon cessation of illumination, the input capacitance of the FET discharges, and the FET returns to its initial current conduction state. Members of this class of opto-isolators are often referred to as optically toggled switches and are available in linear and bilateral embodiments as well as unilateral embodiments.

While these switches represent a significant advance in the art and are perfectly adequate for many applications, they sometimes have one undesirable feature. The bilateral embodiments typically have a shunt resistance connected between the gate and source electrodes to permit the input capacitance of the FET to discharge within a reasonable time after the light source is turned off, and the switch to revert to the initial state. However, the shunt resistance also permits a leakage current to flow when the switch is OFF. There are, of course, many components of the total leakage current such as that due to leakage through the FET. However, the dominant components of the leakage current in the OFF state are a result of the presence of the shunt resistance and are inversely proportional to the sum of the shunt resistance and the load resistance. This sum is normally dominated by the shunt resistance, which is typically in the megohm range, and the leakage currents are therefore generally in the microamp range.

SUMMARY OF THE INVENTION

We have found that a bilateral optically toggled switch using the voltage developed by a series connected and illuminated photodiode array to control the current through a first photovoltaically controlled FET may be constructed with a small leakage current in the OFF state. The switch uses a second photovoltaically controlled FET connected to provide a high resistance between the gate and source of the first FET. The term photovoltaically controlled FET means that current through and resistance of the FET is controlled by a series connected and illuminated photodiode array. The illumination is typically provided by a light emitting diode in the input circuit. The second FET functions as a shunt resistance and reduces the size of the leakage current in the OFF state.

In one preferred embodiment, the current through and resistance of the second FET are controlled by the same photodiode array that controls the current through the first FET.

DETAILED DESCRIPTION

It is believed that the switches of this invention will be better understood if the origin of the external components of the leakage current in optically toggled switches is first described. This will be done by reference to a representative bilateral prior art switch schematically depicted in FIG. 1.

Figure 1:
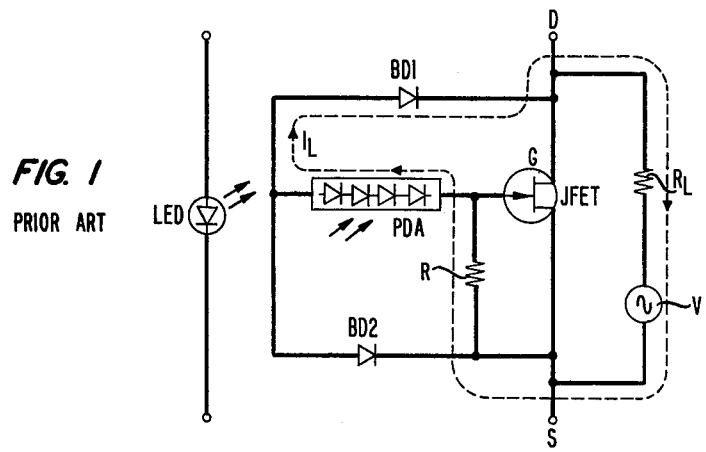
FIG. 1 is a schematic representation of a prior art optically toggled switch.

The switch depicted in FIG. 1 is a normally ON bilateral switch. The light source, which is located in the electrical input circuit, is a light emitting diode, represented by LED. An n-channel depletion mode FET has drain, gate and source electrodes represented by D, G and S, respectively. A series connected photodiode array, represented by PDA, has one terminal connected to the gate, G, electrode of the JFET. The other terminal of the BDA is connected to the anodes of blocking diodes 1 and 2, represented by BD1 and BD2, respectively. The cathodes of BD1 and BD2 are connected to the drain and source electrodes of the JFET, respectively. Electrodes D and S are the output terminals. The shunt resistance, R, is connected between the gate and source electrodes of the JFET. The external electrical output circuit is connected to the output terminals and is represented by a load resistance, $R_L$, and a voltage source, V.

Upon illumination by the LED, the PDA develops a voltage which, because of the number of series connected photodiodes, exceeds the sum of the pinch-off voltage of the JFET and the forward voltage drop of either BD1 or BD2. The radiation from the LED is schematically represented by the arrows. The switch is bilateral, i.e., its operation does not depend upon the polarity of the drain-source bias. When the pinch-off voltage is exceeded, the normally ON FET switches to the OFF state. That is, the FET changes from its initial conducting state to its complementary nonconducting state. After the LED is turned off and ceases to illuminate the PDA, the FET input capacitance discharges through the shunt resistance, R, and the FET returns to its normally ON initial state.

In the OFF state, a leakage current develops which flows through the load resistor, $R_L$. The leakage current has components due to leakage through the JFET and blocking diodes, BD1 and BD2, as well as the dominant, at least at room temperature, component $I_L$. The dominant component of the leakage current is schematically represented in FIG. 1 by the dashed line with the arrows indicating the direction of current flow.

The origin of the dominant component is easily understood. $I_L$ results from the voltage, represented by $V_{PDA}$, developed by the photodiode array, and the externally applied voltage V. It is present only when the source, S, is positive with respect to the drain, D. Its value may be represented approximately by $I_L = (V + V_{PDA})/(R + R_L)$. $R_L$ is normally small in comparison with R. Consequently, this component of the leakage current is generally in the microamp range because R is normally in the megohm range.

Figure 2:
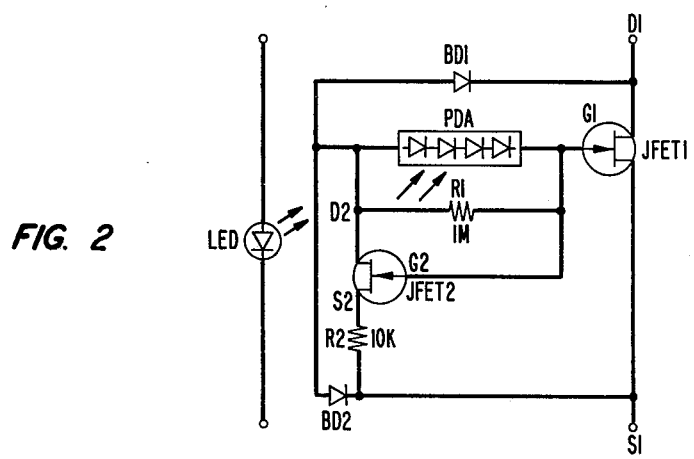
FIG. 2 is a schematic representation of one preferred embodiment of an optically toggled switch of this invention having a low leakage current.

FIG. 2 schematically represents one embodiment of an optically toggled switch of this invention having a low leakage current. The electrical input circuit has a light source which is represented as a light emitting diode (LED). The n-channel depletion mode field effect transistor, JFET1 has electrodes D1, G1 and S1 which are the drain, gate and source electrodes, respectively. The output circuit (not shown) is connected across electrodes D1 and S1. Photodiode array, PDA, has one terminal connected to electrode G1 and the other terminal connected to the anodes of blocking diodes 1 and 2, which are represented by BD1 and BD2, respectively. PDA is optically coupled to the light source. The number of series connected photodiodes in PDA is sufficient to produce a voltage, when illuminated, in excess of the JFET pinch-off voltage by at least one diode drop. This changes the current conduction state of the JFET from ON to OFF. The cathodes of BD1 and BD2 are connected to electrodes D1 and S1, respectively. Resistance R1 is parallel connected with PDA. The n-channel depletion mode field effect transistor JFET2 has electrodes D2, G2 and S2 which are the drain, gate and source electrodes, respectively. D2 is connected to the anodes of BD1 and BD2. G2 is connected to G1, and S2 is series connected through resistance R2 to electrode S1.

The precise values selected for R1 and R2 are generally not critical. R1, however, should be large enough so that the photodiode array is not loaded when the LED is ON. R1 should also be low enough to allow rapid discharge of the input capacitances of JFETs 1 and 2 when the LED is turned OFF. The precise value of R2 is even less critical, but it should be large with respect to the channel resistance of JFET1. Ideally, it can be the channel resistance of JFET2. R1 typically has a value of 1 megohm, and R2 typically is approximately 10 kilohms.

Current flowing in the electrical input circuit causes the LED to emit light, which is represented schematically by the arrows. Some of the emitted light falls upon the PDA which has a sufficient number of series connected photodiodes so that upon illumination, the voltage produced is greater than the pinch-off voltages of JFET1 and JFET2. Upon illumination, the voltage produced by PDA thus changes both JFET1 and JFET2 from their normally ON states to their complementary OFF states. In the OFF state, JFET2 has a very high impedance, typically of the order of many megohms, and as a result, the leakage current flowing through JFET2 will be very small. The OFF state leakage current for the switch described as typically less than 50 nanoamps. When the LED is turned OFF, the switch returns to its initial state as the input capacitances of JFET1 and JFET2 discharge.

Figure 3:
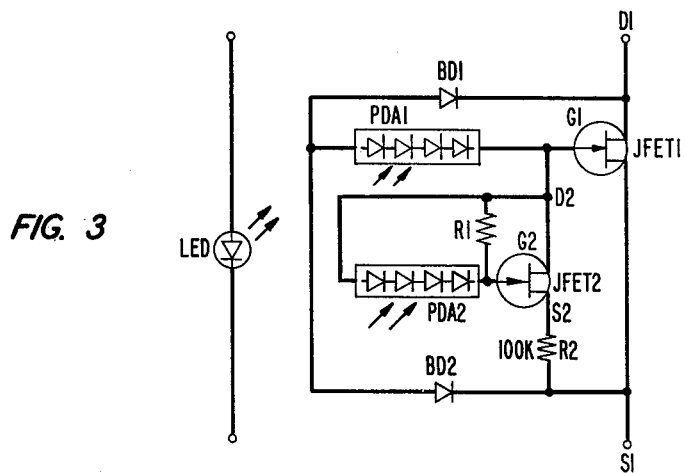
FIG. 3 is a schematic representation of another preferred embodiment of an optically toggled switch of this invention having a low leakage current.

Another embodiment of this invention is schematically represented in FIG. 3. The switch depicted is a normally ON bilateral switch. The light source is a light emitting diode, represented by LED, which is located in the electrical input circuit. A first series connected photodiode array, represented by PDA1, has one terminal connected to the gate, represented by G1, electrode of n-channel depletion mode JFET1. PDA1 is optically coupled to the LED and has a number of photodiodes that is sufficient to produce a voltage between G1 and S1, when illuminated, that exceeds the pinch-off voltage of JFET1. The other terminal of PDA1 is connected to the anodes of blocking diodes 1 and 2, represented by BD1 and BD2, respectively. The cathodes of BD1 and BD2 are connected to the drain, terminal of PDA1 is connected to the anodes of blocking diodes 1 and 2, represented by BD1 and BD2, respectively. The cathodes of BD1 and BD2 are connected to the drain, represented by D1, and source, represented by S1, electrodes of JFET1, respectively. Electrodes D1 and S1 from the output terminals. The shunt resistance between electrodes G1 and S1 is formed by series connected n-channel depletion mode JFET2 having drain, gate and source electrodes represented by D2, G2 and S2, respectively, and resistance R2. R2 is shown series connected between electrodes S2 and S1, although it could also be connected between D2 and G1. A typical value for R2 is 100 kilohms. A second series connected photodiode array, represented by PDA2, is connected between electrodes D2 and G2. PDA2 is also optically coupled to the light source in the electrical input circuit. The number of photodiodes in PDA2 is sufficient to produce a voltage, when illuminated, that exceeds the pinch-off voltage of JFET2. Resistance R1 is connected between electrodes G2 and D2, i.e., it is parallel connected with PDA2.

When an electrical current flows in the input circuit, the LED emits light, and both PDA1 and PDA2 are simultaneously illuminated. Upon illumination of PDA1, JFET1 changes from its initial ON state to its complementary OFF state. Upon illumination of PDA2, JFET2 changes from its initial ON state to its complementary OFF state. In its OFF state, JFET 2 offers a high impedance to any leakage current and, therefore, the leakage current of the switch in the OFF state is small.

The circuits described with respect to both FIGS. 2 and 3 have symmetrical I-V responses. If such a response is not required, R2 may be omitted from either switch. The asymmetrical response arises because larger currents flow through the switch in the ON state when the source is positive with respect to the drain than vice versa.

Although optically toggled switches of this invention with low leakage currents resulting from a photovoltaically controlled FET providing a high resistance for the leakage current have been described with respect to two particular embodiments, it is to be understood that other embodiments are also contemplated and will be readily thought of by those working in the art. For example, for many field effect transistors, the characteristics are symmetrical with respect to the source and drain. In other words, connections that are described as being made to source and drain could be made to drain and source, respectively. Accordingly, for such FETs, the terms source and drain can be used interchangeably and are so used in this specification. Additionally light sources other than LEDs may be used and they may control the current conduction state of the FET. Furthermore, other types of FETs, such as p-channel depletion mode FETs, may be used.

We claim:

1. An optically toggled field effect transistor switch comprising:
   a first field effect transistor, said transistor having source, gate and drain electrodes;
   a first series connected photodiode array, said photodiode array producing a voltage, when illuminated, that controls said current through said first field effect transistor;
   first and second blocking diodes, said diodes each having a first electrode connected to one of said drain and source electrodes, respectively, said diodes each having a second electrode connected to said photodiode array;
   a first resistance, said first resistance being between said gate and source electrodes of said first field effect transistor of said first FET, CHARACTERIZED IN THAT said first resistance comprises a second field effect transistor, said second field effect transistor having drain, gate and source electrodes, and said switch further comprises means for controlling the current conduction state of said second field effect transistor.

2. A field effect transistor switch as recited in claim 1 further comprising a light source, said light source being optically coupled to said first photodiode array.

3. A field effect transistor switch as recited in claim 2 in which said drain electrode of said second field effect transistor is connected to said photodiode array and to one electrode of at least one blocking diode, and said gate and source electrodes of said second field effect transistor are connected to said gate and source electrodes of said first field effect transistor, respectively.

4. A field effect transistor switch as recited in claim 3 further comprising a second resistance, said second resistance being parallel connected with said photodiode array.

5. A field effect transistor switch as recited in claim 4 further comprising a third resistance, said third resistance being series connected between said source electrodes of said first and said second field effect transistors.

6. A field effect transistor switch as recited in claim 4 further comprising a third resistance, said third resistance being series connected between said source electrode of said second field effect transistor, and said source electrode of said first field effect transistor.

7. A field effect transistor switch as recited in claim 1 in which said drain and source electrodes of said second field effect transistor are connected to said gate and source electrodes of said first field effect transistor, and said means for controlling comprises a second series connected photodiode array, said array having terminals connected to said gate and drain electrodes of said second field effect transistor.

8. A field effect transistor switch as recited in claim 7 further comprising a second resistance, said second resistance being connected between said gate and drain electrodes of said second field effect transistor.

9. A switch as recited in claim 1 in which said means for controlling comprises said first series connected photodiode array.

* * * * *